(12) United States Patent
Kim et al.

(10) Patent No.: US 11,514,998 B2
(45) Date of Patent: Nov. 29, 2022

(54) ELECTRONIC DEVICE FOR PERFORMING DATA MASKING OPERATION

(71) Applicant: SK hynix Inc., Icheon-si (KR)

(72) Inventors: Dae Suk Kim, Icheon-si (KR); Hoi Ju Chung, Icheon-si (KR); Dong Kyun Kim, Icheon-si (KR); Jeong Jun Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/370,726

(22) Filed: Jul. 8, 2021

(65) Prior Publication Data

US 2022/0262449 A1 Aug. 18, 2022

(30) Foreign Application Priority Data

Feb. 18, 2021 (KR) .................. 10-2021-0022194

(51) Int. Cl.
*G11C 29/42* (2006.01)
*G11C 29/44* (2006.01)
*G11C 29/12* (2006.01)
*G11C 7/10* (2006.01)

(52) U.S. Cl.
CPC .............. *G11C 29/42* (2013.01); *G11C 7/106* (2013.01); *G11C 7/1009* (2013.01); *G11C 7/1039* (2013.01); *G11C 7/1087* (2013.01); *G11C 29/12015* (2013.01); *G11C 29/4401* (2013.01)

(58) Field of Classification Search
CPC ..... G11C 29/42; G11C 7/1009; G11C 7/1039; G11C 7/106; G11C 29/12
See application file for complete search history.

(56) References Cited

U.S. PATENT DOCUMENTS

| | | | |
|---|---|---|---|
| 2017/0286218 A1* | 10/2017 | Kim .................... | G06F 11/1048 |
| 2018/0293133 A1* | 10/2018 | Lee ..................... | G06F 11/1048 |
| 2019/0087263 A1* | 3/2019 | Cha .................... | G06F 11/1048 |
| 2022/0059178 A1* | 2/2022 | Moon ................... | G11C 29/44 |

FOREIGN PATENT DOCUMENTS

KR 1020130116171 A 10/2013

* cited by examiner

*Primary Examiner* — Han Yang
(74) *Attorney, Agent, or Firm* — William Park & Associates Ltd.

(57) ABSTRACT

An electronic device includes a core circuit configured to store write data and a write parity after outputting read data and a read parity in a data masking operation. The electronic device also includes an error correction circuit configured to correct an error included in the read data, based on the read parity; generate the write parity from the error-corrected read data, input data, and masking data; and generate the write data from the error-uncorrected read data, the input data, and the masking data.

21 Claims, 17 Drawing Sheets

FIG. 10
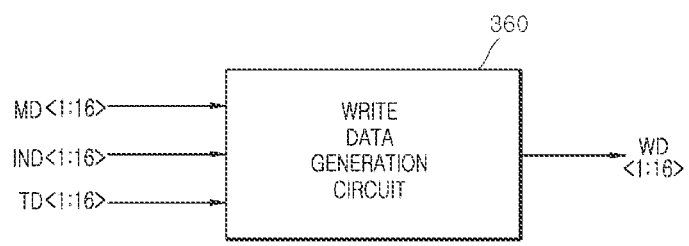
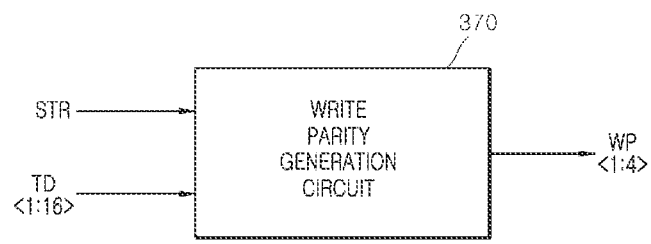

US 11,514,998 B2

ELECTRONIC DEVICE FOR PERFORMING DATA MASKING OPERATION

CROSS-REFERENCE TO RELATED APPLICATION

The present application claims priority under 35 U.S.C. § 119(a) to Korean Patent Application No. 10-2021-0022194 filed on Feb. 18, 2021 in the Korean Intellectual Property Office, which is incorporated herein by reference in its entirety.

BACKGROUND

1. Technical Field

Embodiments of the present disclosure may generally relate to an electronic device for performing a data masking operation, which generates a write parity from error-corrected read data and generates write data from error-uncorrected read data, in the data masking operation.

2. Related Art

Recently, in order to increase the operating speed of a semiconductor device, various schemes of inputting/outputting data including a plurality of bits in each clock cycle are being used. In the case where an input/output speed of data is increased, the probability of occurrence of an error during a data transmission process also increases. Therefore, a separate device and method for ensuring the reliability of data transmission are additionally demanded.

For example, there is used a method of generating error codes capable of checking the occurrence of an error and transmitting the error codes together with data, at each time when data is transmitted, thereby ensuring the reliability of data transmission. The error codes include an error detection code (EDC) capable of detecting an occurred error and an error correction code (ECC) capable of self-correcting an error upon occurrence of the error.

SUMMARY

In an embodiment, an electronic device may include a core circuit configured to store write data and a write parity after outputting read data and a read parity in a data masking operation The electronic device may also include an error correction circuit configured to correct an error included in the read data, based on the read parity; generate the write parity from the error-corrected read data, input data, and masking data; and generate the write data from the error-uncorrected read data, the input data, and the masking data.

In an embodiment, an electronic device may include a masking data generation circuit configured to generate masking data from a masking signal inputted from outside the electronic device. The electronic device may also include an error control circuit configured to generate a correction control signal for correcting an error of read data, from a read parity generated in an internal read operation. The electronic device may further include a data processing circuit configured to correct an error of the read data by an error control signal and the correction control signal and generate transfer data from the masking data and the error-corrected read data, in the internal read operation, and generate the transfer data from the masking data and the error-uncorrected read data in an internal write operation.

BRIEF DESCRIPTION OF THE DRAWINGS

FIG. 10 is a block diagram illustrating a configuration of a write control circuit included in the electronic device illustrated in FIG. 2.

DETAILED DESCRIPTION

Figure 1:
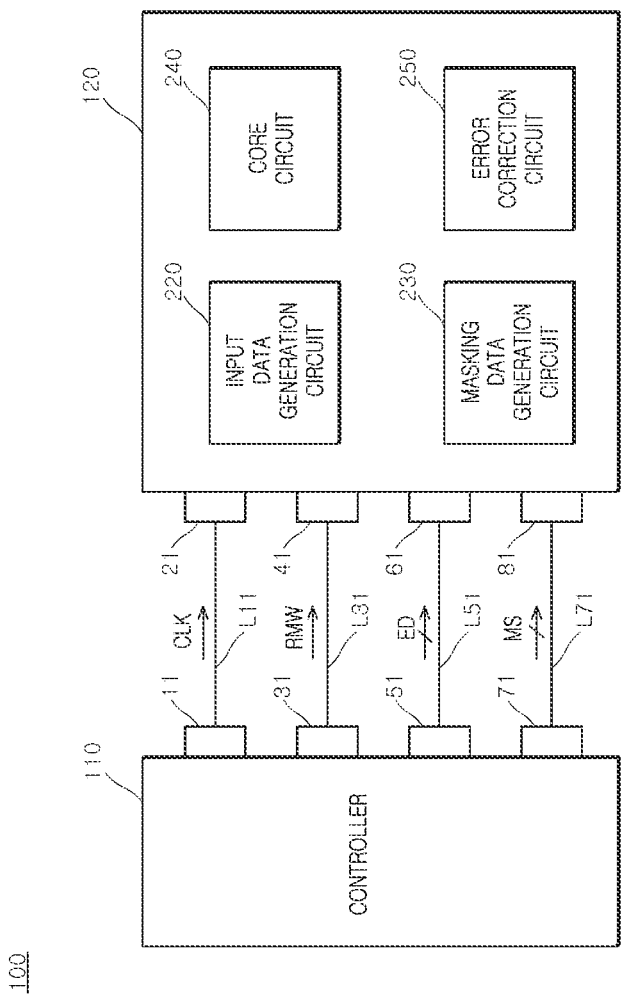
FIG. 1 is a block diagram illustrating a configuration of an electronic system in accordance with an embodiment of the present disclosure.

The term "preset" means that a numerical value of a parameter is predetermined when the parameter is used in a process or algorithm. Depending on an embodiment, the numerical value of the parameter may be set when a process or algorithm starts or may be set during a period in which the process or algorithm is executed.

Terms such as "first" and "second" used to distinguish various components are not limited by the components. For example, a first component may be named a second component, and conversely, the second component may be named the first component. Further, the terms "first" and "second" are not meant to imply an order or number of components.

When it is described that one component is "coupled" or "connected" to another component, it is to be understood that the one component may be coupled or connected to the other component either directly or through one or more additional components. On the other hand, the descriptions of "directly coupled" or "directly connected" should be understood to mean that one component is coupled or connected to another component without intervention of any additional component.

"Logic high level" and "logic low level" are used to describe logic levels of signals. A signal having a "logic high level" is distinguished from a signal having a "logic low level," For example, when a signal having a first voltage corresponds to a "logic high level," a signal having a second voltage may correspond to a "logic low level." Depending on an embodiment, a "logic high level" may be set to a voltage higher than a "logic low level." Meanwhile, depending on an embodiment, logic levels of signals may be set to different logic levels or opposite logic levels. For example, depending on an embodiment, a signal having a logic high level may be set to have a logic low level, and a signal having a logic low level may be set to have a logic high level.

Hereinafter, various embodiments of the present disclosure will be described in detail with reference to the accompanying drawings. These embodiments are only intended for illustrating the present disclosure, and the scope of protection of the present disclosure is not limited by these embodiments.

Various embodiments are directed to an electronic system which supports, in a data masking operation, a write-back disable operation of generating a write parity using error-corrected read data in an internal read operation and restoring write data, generated from error-uncorrected read data, and the write parity in an internal write operation.

According to the present disclosure, an electronic system may support, in a data masking operation, a write-back disable operation of generating a write parity using error-corrected read data in an internal read operation and restoring write data, generated from error-uncorrected read data, and the write parity in an internal write operation.

Also, according to the present disclosure, the electronic system may secure the reliability of data stored in a data area, by, in a data masking operation, generating a write parity using error-corrected read data in an internal read operation and restoring write data, generated from error-uncorrected read data, and the write parity in an internal write operation.

As illustrated in FIG. 1, an electronic system 100 in accordance with an embodiment of the present disclosure may include a controller 110 and an electronic device 120. The electronic device 120 may include an input data generation circuit 220, a masking data generation circuit 230, a core circuit 240, and an error correction circuit 250.

The controller 110 may include a first control pin 11, a second control pin 31, a third control pin 51, and a fourth control pin 71. The electronic device 120 may include a first semiconductor pin 21, a second semiconductor pin 41, a third semiconductor pin 61, and a fourth semiconductor pin 81. A first transmission line L11 may be coupled between the first control pin 11 and the first semiconductor pin 21. A second transmission line L31 may be coupled between the second control pin 31 and the second semiconductor pin 41, A third transmission line L51 may be coupled between the third control pin 51 and the third semiconductor pin 61. A fourth transmission line L71 may be coupled between the fourth control pin 71 and the fourth semiconductor pin 81. The controller 110 may transmit a clock CLK to the electronic device 120 through the first transmission line L11. The controller 110 may transmit a command RMW to the electronic device 120 through the second transmission line L31. The controller 110 may transmit external data ED to the electronic device 120 through the third transmission line L51. The controller 110 may transmit a masking signal MS to the electronic device 120 through the fourth transmission line L71. The command RMW may be set as a command for controlling a data masking operation.

The controller 110 may output the clock CLK and the command RMW for controlling the data masking operation, to the electronic device 120, In the data masking operation, the controller 110 may output the external data ED, which is to be stored in the electronic device 120, to the electronic device 120, In the data masking operation, the controller 110 may output the masking signal MS for masking the external data ED, to the electronic device 120. The command RMW, the external data ED, and the masking signal MS may be successively inputted and outputted in synchronization with odd pulses or even pulses included in the clock CLK.

The input data generation circuit 220 may generate input data IND<1:16> (see FIG. 2) from the external data ED in synchronization with the clock CLK.

The masking data generation circuit 230 may generate masking data MD<1:16> (see FIG. 2) from the masking signal MS in synchronization with the clock CLK.

In an internal read operation of the data masking operation, the core circuit 240 may output read data RD<1:16> (see FIG. 2) and read parities RP<1:4> (see FIG. 2), stored therein, to the error correction circuit 250. In an internal write operation of the data masking operation, the core circuit 240 may receive write data WD<1:16> (see FIG. 2) and write parities WP<1:4> (see FIG. 2) from the error correction circuit 250, and may store the received write data WD<1:16> and write parities WP<1:4>.

Figure 2:
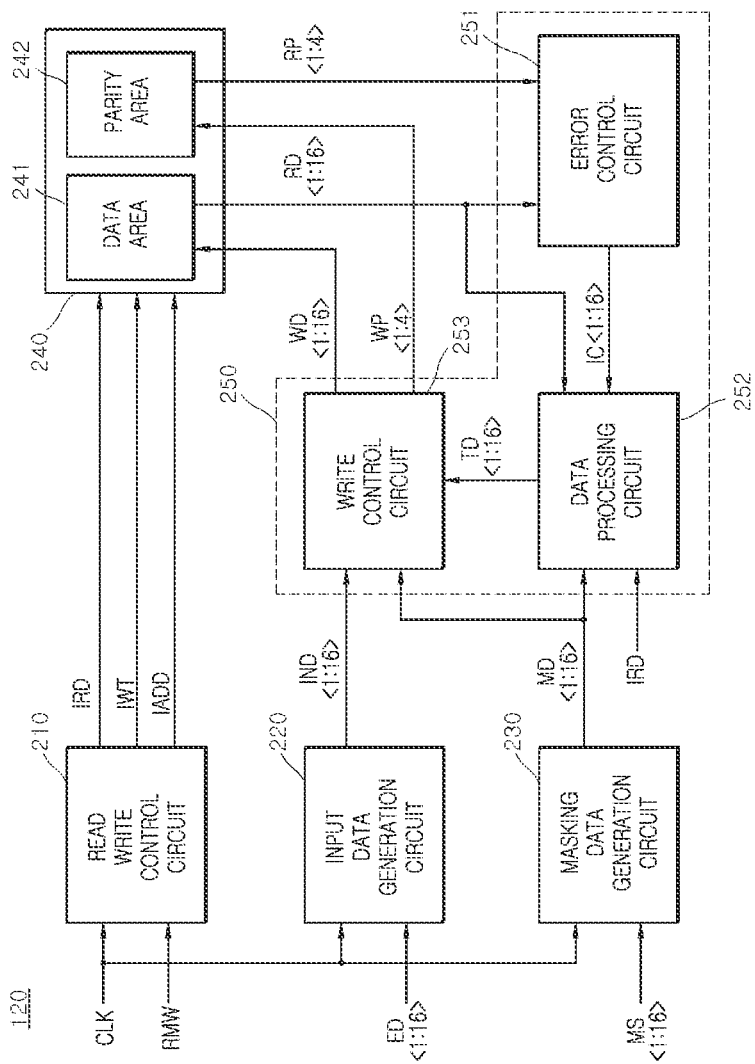
FIG. 2 is a block diagram illustrating a configuration of an electronic device included in the electronic system illustrated in FIG. 1.

In the internal read operation, the error correction circuit 250 may correct an error included in the read data RD<1:16> (see FIG. 2), based on the read parities RP<1:4> (see FIG. 2). In the internal read operation, the error correction circuit 250 may generate the write parities WP<1:4> (see FIG. 2) from the error-corrected read data RD<1:16> (see FIG. 2), the input data IND<1:16> (see FIG. 2), and the masking data MD<1:16> (see FIG. 2), In the internal write operation, the error correction circuit 250 may generate the write data WD<1:16> (see FIG. 2) from the error-uncorrected read data RD<1:16> (see FIG. 2), the input data IND<1:16> (see FIG. 2), and the masking data MD<1:16> (see FIG. 2), FIG. 2 is a block diagram illustrating a configuration of the electronic device 120 in accordance with an embodiment of the present disclosure. As illustrated in FIG. 2, the electronic device 120 may include a read write control circuit 210, the input data generation circuit 220, the masking data generation circuit 230, the core circuit 240, and the error correction circuit 250.

The read write control circuit 210 may generate an internal read command IRD, an internal write command IWT, and an address IADD from the command RMW in synchronization with the clock CLK. In the data masking operation, the read write control circuit 210 may generate the internal read command IRD and the address IADD for performing the internal read operation, from the command RMW in synchronization with the clock CLK. In the data masking operation, the read write control circuit 210 may generate the internal write command IWT and the address IADD for performing the internal write operation, from the command RMW in synchronization with the clock CLK, In the data masking operation, the internal write operation may be successively performed after the internal read operation is performed.

The input data generation circuit 220 may generate first to sixteenth input data IND<1:16> based on first to sixteenth external data ED<1:16> in synchronization with the clock CLK, The input data generation circuit 220 may generate the first to sixteenth input data IND<1:16> by buffering the first to sixteenth external data ED<1:16> in synchronization with the clock CLK. The input data generation circuit 220 may generate the first to sixteenth input data IND<1:16> based on the first to sixteenth external data ED<1:16> in synchronization with the rising edges or falling edges of the clock CLK.

The masking data generation circuit 230 may generate first to sixteenth masking data MD<1:16> based on first to sixteenth masking signals MS<1:16> in synchronization with the clock CLK. The masking data generation circuit 230 may generate the first to sixteenth masking data MD<1:16> by buffering the first to sixteenth masking signals MS<1:16> in synchronization with the clock CLK. The masking data generation circuit 230 may generate the first to sixteenth masking data MD<1:16> based on the first to sixteenth masking signals MS<1:16> in synchronization with the rising edges or falling edges of the clock CLK, The first to sixteenth masking signals MS<1:16> may be implemented with the same number of bits as the first to sixteenth external data ED<1:16>, Some bits of the first to sixteenth masking signals MS<1:16> may be inputted at logic high levels so as to mask some bits of the first to sixteenth external data ED<1:16>.

The core circuit 240 may include a data area 241 and a parity area 242. When the internal read command IRD is inputted, the core circuit 240 may output first to sixteenth read data RD<1:16> stored in the data area 241, based on the address IADD. When the internal read command IRD is inputted, the core circuit 240 may output first to fourth read parities RP<1:4> stored in the parity area 242, based on the address IADD. The first to fourth read parities RP<1:4> may be set as signals which include error information of the first to sixteenth read data RD<1:16>. When the internal write command IWT is inputted, the core circuit 240 may store first to sixteenth write data WD<1:16> in the data area 241 based on the address IADD. When the internal write command IWT is inputted, the core circuit 240 may store first to fourth write parities WP<1:4> in the parity area 242 based on the address IADD. The first to fourth write parities WP<1:4> may be set as signals which include error information of the first to sixteenth write data WD<1:16>.

The error correction circuit 250 may include an error control circuit 251, a data processing circuit 252, and a write control circuit 253.

In the internal read operation, the error control circuit 251 may generate first to sixteenth correction control signals IC<1:16> for correcting an error included in the first to sixteenth read data RD<1:16>, from the first to fourth read parities RP<1:4.

In the internal read operation, the data processing circuit 252 may generate an error control signal ECCCTR (see FIG. 6) from the internal read command IRD. The data processing circuit 252 may generate the error control signal ECCCTR (see FIG. 6) which is disabled when the internal read command IRD is inputted. In the internal read operation, the data processing circuit 252 may correct an error of the first to sixteenth read data RD<1:16> by the error control signal ECCCTR (see FIG. 6) and the first to sixteenth correction control signals IC<1:16>. In the internal read operation, the data processing circuit 252 may generate first to sixteenth transfer data TD<1:16> from the first to sixteenth masking data MD<1:16> and the error-corrected first to sixteenth read data RD<1:16>. In the internal write operation, the data processing circuit 252 may generate the first to sixteenth transfer data TD<1:16> from the first to sixteenth masking data MD<1:16> and the error-uncorrected first to sixteenth read data RD<1:16>.

In the internal read operation, the write control circuit 253 may generate the first to fourth write parities WP<1:4> by performing an ECC encoding operation on the first to sixteenth transfer data TD<1:16>. In the internal write operation, the write control circuit 253 may generate the first to sixteenth write data WD<1:16> from the first to sixteenth transfer data TD<1:16>, the first to sixteenth masking data MD<1:16>, and the first to sixteenth input data IND<1:16>.

As such, in the internal read operation, the error correction circuit 250 may correct an error included in the first to sixteenth read data RD<1:16>, based on the first to fourth read parities RP<1:4>. In the internal read operation, the error correction circuit 250 may generate the first to fourth write parities WP<1:4> from the error-corrected first to sixteenth read data RD<1:16>, the first to sixteenth input data IND<1:16>, and the first to sixteenth masking data MD<1:16>. In the internal write operation, the error correction circuit 250 may generate the first to sixteenth write data WD<1:16> from the error-uncorrected first to sixteenth read data RD<1:16>, the first to sixteenth input data IND<1:16>, and the first to sixteenth masking data MD<1:16>.

Figure 3:
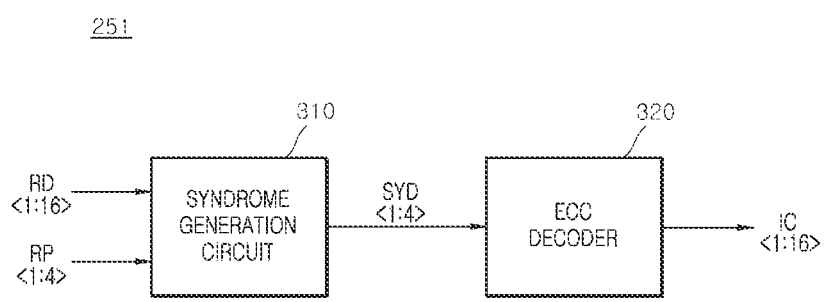
FIG. 3 is a block diagram illustrating a configuration of an error control circuit included in the electronic device illustrated in FIG. 2.

FIG. 3 is a block diagram illustrating a configuration of the error control circuit 251 in accordance with an embodiment of the present disclosure. As illustrated in FIG. 3, the error control circuit 251 may include a syndrome generation circuit 310 and an ECC decoder 320.

The syndrome generation circuit 310 may generate first to fourth syndromes SYD<1:4>, including location information of an error included in the first to sixteenth read data RD<1:16>, from the first to sixteenth read data RD<1:16> and the first to fourth read parities RP<1:4>.

The ECC decoder 320 may generate the first to sixteenth correction control signals IC<1:16> by performing an ECC decoding operation on the first to fourth syndromes SYD<1:4>. The ECC decoder 320 may generate the first to sixteenth correction control signals IC<1:16> by decoding the first to fourth syndromes SYD<1:4>.

The ECC decoding operation may include an operation of generating the first to fourth syndromes SYD<1:4> from the first to sixteenth read data RD<1:16> and the first to fourth read parities RP<1:4> and an operation for generating the first to sixteenth correction control signals IC<1:16> by decoding the first to fourth syndromes SYD<1:4>.

Figure 4:
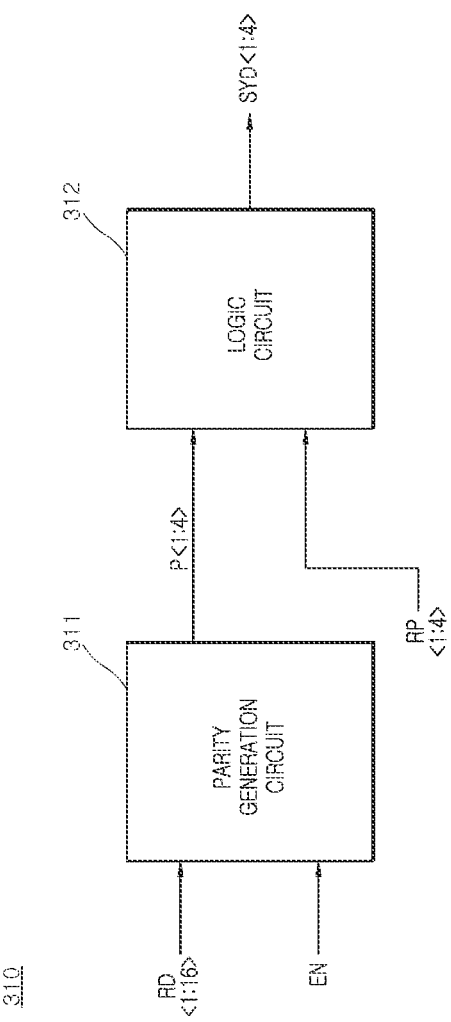
FIG. 4 is a block diagram illustrating a configuration of a syndrome generation circuit included in the error control circuit illustrated in FIG. 3.

FIG. 4 is a block diagram illustrating a configuration of the syndrome generation circuit 310 in accordance with an embodiment of the present disclosure. As illustrated in FIG. 4, the syndrome generation circuit 310 may include a parity generation circuit 311 and a logic circuit 312.

The parity generation circuit 311 may generate first to fourth parities P<1:4> from the first to sixteenth read data RD<1:16> during an enable period of an enable signal EN. The parity generation circuit 311 may generate the first to fourth parities P<1:4> from the first to sixteenth read data RD<1:16> by using an error correction code (ECC) during the enable period of the enable signal EN. In the internal read operation, the parity generation circuit 311 may generate the first to fourth parities P<1:4> by performing an ECC encoding operation on the first to sixteenth read data RD<1:16>. The enable signal EN may be set as a signal which is enabled in the data masking operation.

The logic circuit 312 may generate the first to fourth syndromes SYD<1:4> by comparing the first to fourth parities P<1:4> and the first to fourth read parities RP<1:4>.

Figure 5:
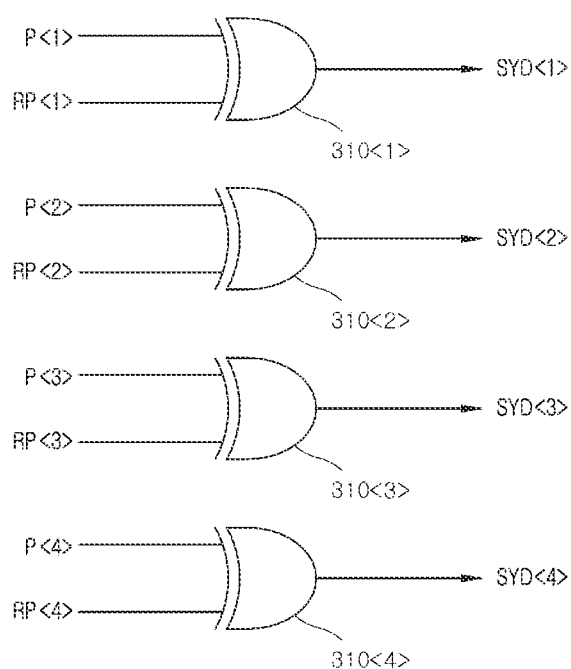
FIG. 5 is a circuit diagram illustrating a configuration of a logic circuit included in the syndrome generation circuit illustrated in FIG. 4.

FIG. 5 is a circuit diagram illustrating a configuration of the logic circuit 312 in accordance with an embodiment of the present disclosure. As illustrated in FIG. 5, the logic circuit 312 may be implemented by exclusive OR gates 310<1>, 310<2>, 310<3>, and 310<4>.

The exclusive OR gate 310<1> may generate the first syndrome SYD<1> by comparing the first parity P<1> and the first read parity RP<1>. The exclusive OR gate 310<1> may generate the first syndrome SYD<1> by performing an exclusive OR operation on the first parity P<1> and the first read parity RP<1>, When logic levels of the first parity P<1> and the first read parity RP<1> are different from each other, the exclusive OR gate 310<1> may generate the first syndrome SYD<1> having a logic high level.

The exclusive OR gate 310<2> may generate the second syndrome SYD<2> by comparing the second parity P<2> and the second read parity RP<2>. The exclusive OR gate 310<2> may generate the second syndrome SYD<2> by performing an exclusive OR operation on the second parity P<2> and the second read parity RP<2>, When logic levels of the second parity P<2> and the second read parity RP<2> are different from each other, the exclusive OR gate 310<2> may generate the second syndrome SYD<2> having a logic high level.

The exclusive OR gate 310<3> may generate the third syndrome SYD<3> by comparing the third parity P<3> and the third read parity RP<3>, The exclusive OR gate 310<3> may generate the third syndrome SYD<3> by performing an exclusive OR operation on the third parity P<3> and the third read parity RP<3>. When logic levels of the third parity P<3> and the third read parity RP<3> are different from each other, the exclusive OR gate 310<3> may generate the third syndrome SYD<3> having a logic high level.

The exclusive OR gate 310<4> may generate the fourth syndrome SYD<4> by comparing the fourth parity P<4> and the fourth read parity RP<4>. The exclusive OR gate 310<4> may generate the fourth syndrome SYD<4> by performing an exclusive OR operation on the fourth parity P<4> and the fourth read parity RP<4>, When logic levels of the fourth parity P<4> and the fourth read parity RP<4> are different from each other, the exclusive OR gate 310<4> may generate the fourth syndrome SYD<4> having a logic high level.

Figure 6:
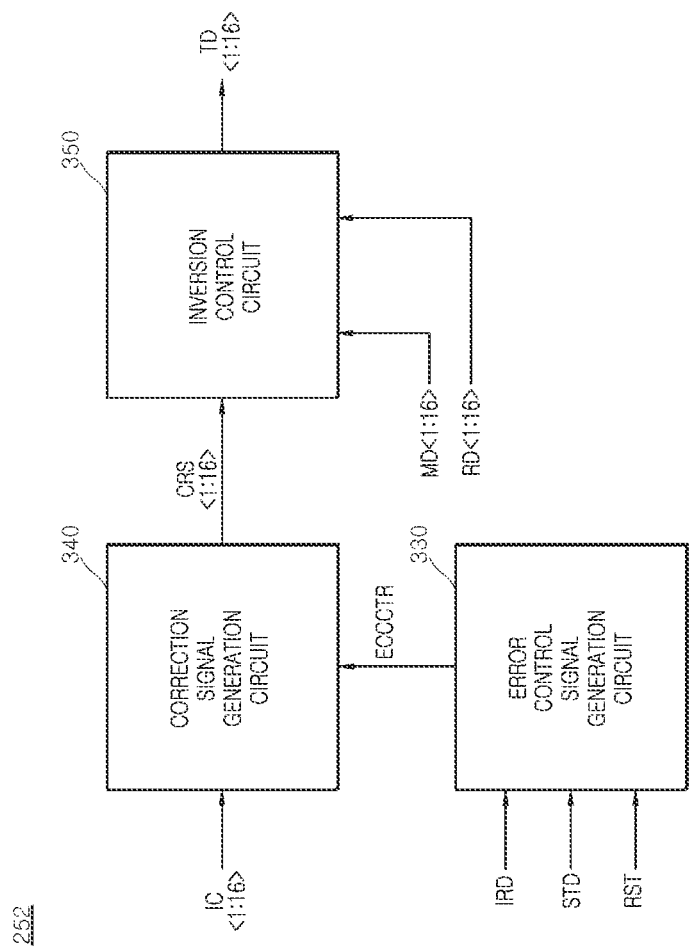
FIG. 6 is a block diagram illustrating a configuration of a data processing circuit included in the electronic device illustrated in FIG. 2.

FIG. 6 is a block diagram illustrating a configuration of the data processing circuit 252 in accordance with an embodiment of the present disclosure. As illustrated in FIG. 6, the data processing circuit 252 may include an error control signal generation circuit 330, a correction signal generation circuit 340, and an inversion control circuit 350.

The error control signal generation circuit 330 may generate the error control signal ECCCTR which is disabled when the internal read command IRD is inputted. The error control signal generation circuit 330 may generate the error control signal ECCCTR which is enabled when a strobe delay signal STD is inputted. The error control signal generation circuit 330 may generate the error control signal ECCCTR which is disabled when a reset signal RST is inputted. The strobe delay signal STD may be set as a signal which is generated as a start signal STR (see FIG. 10) to be described later is delayed. The reset signal RST may be set as a signal which is generated at a logic low level in an initialization operation in which the electronic device 120 starts to operate.

The correction signal generation circuit 340 may receive the error control signal ECCCTR, and may generate first to sixteenth correction signals CRS<1:16> based on the first to sixteenth correction control signals IC<1:16>. The correction signal generation circuit 340 may generate the first to sixteenth correction signals CRS<1:16> based on the first to sixteenth correction control signals IC<1:16> when the error control signal ECCCTR is disabled. The correction signal generation circuit 340 may block the generation of the first to sixteenth correction signals CRS<1:16> when the error control signal ECCCTR is enabled.

In the internal read operation, the inversion control circuit 350 may generate the first to sixteenth transfer data TD<1:16> by correcting an error of the first to sixteenth read data RD<1:16> by the first to sixteenth masking data MD<1:16> and the first to sixteenth correction signals CRS<1:16>. In the internal read operation, the inversion control circuit 350 may generate the first to sixteenth transfer data TD<1:16> by inverting or not inverting the first to sixteenth read data RD<1:16> depending on logic levels of the first to sixteenth correction signals CRS<1:16>. For example, when the first correction signal CRS<1> is generated at a logic low level, the inversion control circuit 350 may generate the first transfer data TD<1> by inverting the first read data RD<1>. When the first correction signal CRS<1> is generated at a logic high level, the inversion control circuit 350 may generate the first transfer data TD<1> by not inverting the first read data RD<1>. In the internal write operation, the inversion control circuit 350 may generate the first to sixteenth transfer data TD<1:16> by blocking some bits of the first to sixteenth read data RD<1:16> by the first to sixteenth masking data MD<1:16>. For example, when the first masking data MD<1> is inputted at a logic low level, the inversion control circuit 350 may block the input of the first read data RD<1>.

Figure 7:
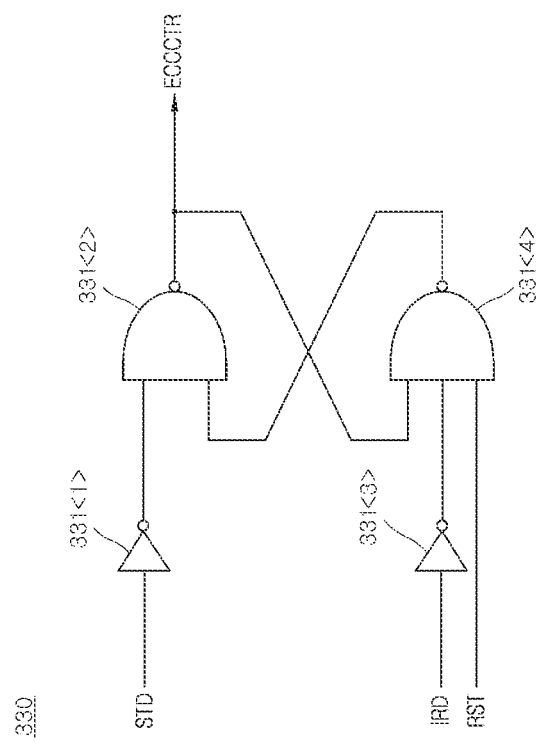
FIG. 7 is a circuit diagram illustrating a configuration of an error control signal generation circuit included in the data processing circuit illustrated in FIG. 6.

FIG. 7 is a circuit diagram illustrating a configuration of the error control signal generation circuit 330 in accordance with an embodiment of the present disclosure. As illustrated in FIG. 7, the error control signal generation circuit 330 may be implemented by inverters 331<1> and 331<3> and NAND gates 331<2> and 331<4>.

When the reset signal RST is inputted at a logic low level in the initialization operation, the error control signal generation circuit 330 may generate the error control signal ECCCTR having a logic low level. When the internal read command IRD is inputted at a logic high level in the internal read operation, the error control signal generation circuit 330 may generate the error control signal ECCCTR having a logic low level. When the strobe delay signal STD is inputted at a logic high level, the error control signal generation circuit 330 may generate the error control signal ECCCTR having a logic high level. The error control signal generation circuit 330 may generate the error control signal ECCCTR which is disabled to a logic low level in the internal read operation and is enabled to a logic high level in the internal write operation.

Figure 8:
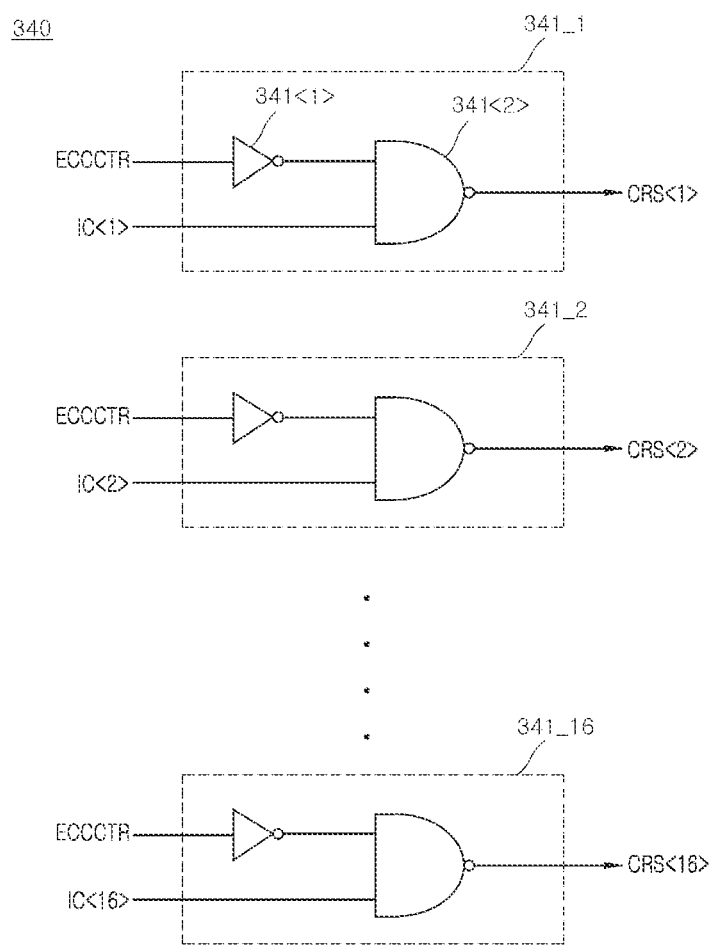
FIG. 8 is a circuit diagram illustrating a configuration of a correction signal generation circuit included in the data processing circuit illustrated in FIG. 6.

FIG. 8 is a circuit diagram illustrating a configuration of the correction signal generation circuit 340 in accordance with an embodiment of the present disclosure. As illustrated in FIG. 8, the correction signal generation circuit 340 may include first to sixteenth correction signal generation circuits 341_1, 341_2, . . . , and 341_16.

The first correction signal generation circuit 341_1 may be implemented by an inverter 341<1> and a NAND gate 341<2>. When the error control signal ECCCTR is disabled to a logic low level, the first correction signal generation circuit 341_1 may generate the first correction signal CRS<1> by inverting and buffering the first correction control signal IC<1>. When the error control signal ECCCTR is enabled to a logic high level, the first correction signal generation circuit 341_1 may generate the first correction signal CRS<1> having a logic high level. When the error control signal ECCCTR is enabled to a logic high level, the first correction signal generation circuit 341_1 may block the generation of the first correction signal CRS<1>.

Each of the second to sixteenth correction signal generation circuits 341_2, . . . and 341_16 may be implemented by the same circuit and may perform the same operation as the first correction signal generation circuit 341_1 except that only input and output signals are different, and thus, detailed description thereof will be omitted herein.

Figure 9:
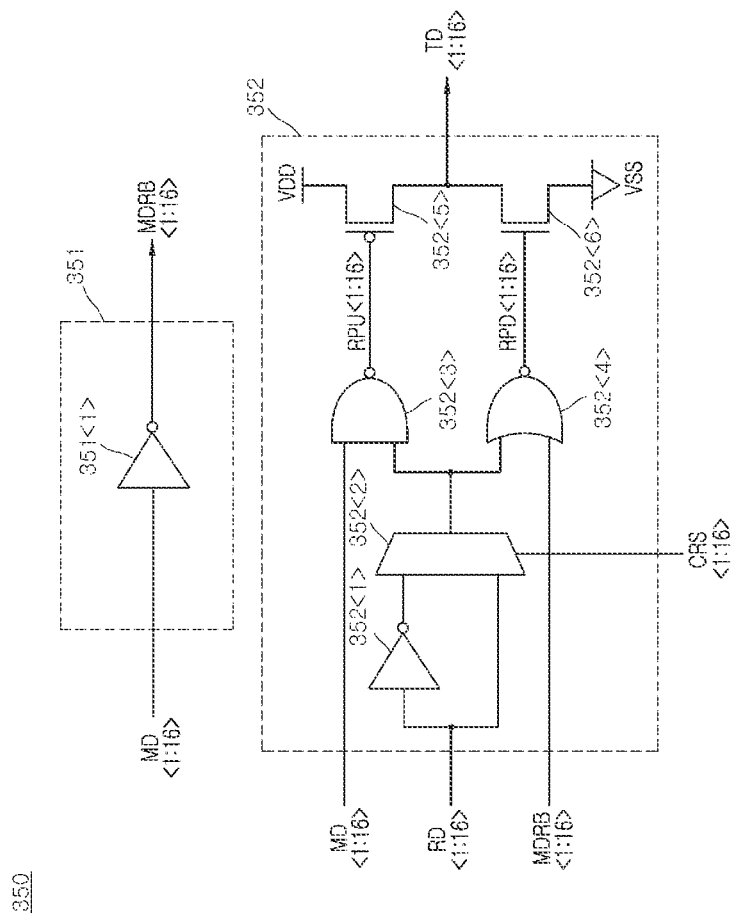
FIG. 9 is a circuit diagram illustrating a configuration of an inversion control circuit included in the data processing circuit illustrated in FIG. 6.

FIG. 9 is a circuit diagram illustrating a configuration of the inversion control circuit 350 in accordance with an embodiment of the present disclosure. As illustrated in FIG. 9, the inversion control circuit 350 may include a read masking signal generation circuit 351 and a read driver 352.

The read masking signal generation circuit 351 may be implemented by an inverter 351<1>. The read masking signal generation circuit 351 may generate first to sixteenth read masking signals MDRB<1:16> by inverting and buffering the first to sixteenth masking data MD<1:16>.

The read driver 352 may be implemented by an inverter 352<1>, a multiplexer 352<2>, a NAND gate 352<3>, a NOR gate 352<4>, a PMOS transistor 352<5>, and an NMOS transistor 352<6>. The inverter 352<1> may invert and buffer the first to sixteenth read data RD<1:16> and output signals. The multiplexer 352<2> may output the output signals of the inverter 352<1> when the first to sixteenth correction signals CRS<1:16> are logic low levels. The multiplexer 352<2> may output the first to sixteenth read data RD<1:16> when the first to sixteenth correction signals CRS<1:16> are logic high levels. When the first to sixteenth masking data MD<1:16> are inputted at logic high levels and output signals of the multiplexer 352<2> are logic high levels, the NAND gate 352<3> may generate first to sixteenth read pull-up signals RPU<1:16> having logic low levels. When the first to sixteenth masking data MD<1:16> are inputted at logic low levels, the NAND gate 352<3> may generate the first to sixteenth read pull-up signals RPU<1:16> having logic high levels. When the first to sixteenth read masking signals MDRB<1:16> are inputted at logic low levels and the output signals of the multiplexer 352<2> are logic low levels, the NOR gate 352<4> may generate first to sixteenth read pull-down signals RPD<1:16> having logic high levels. When the first to sixteenth read masking signals MDRB<1:16> are inputted at logic high levels, the NOR gate 352<4> may generate the first to sixteenth read pull-down signals RPD<1:16> having logic low levels. When the first to sixteenth read pull-up signals RPU<1:16> are inputted at logic low levels, the PMOS transistor 352<5> may generate the first to sixteenth transfer data TD<1:16> having logic high levels by driving the first to sixteenth transfer data TD<1:16> to the level of a power voltage VDD. When the first to sixteenth read pull-down signals RPD<1:16> are inputted at logic high levels, the NMOS transistor 352<6> may generate the first to sixteenth transfer data TD<1:16> having logic low levels by driving the first to sixteenth transfer data TD<1:16> to the level of a ground voltage VSS.

The inversion control circuit 350 may block the generation of the first to sixteenth transfer data TD<1:16> corresponding to bits having logic low levels among the first to sixteenth masking data MD<1:16>. For example, when the first masking data MD<1> is a logic low level, the inversion control circuit 350 may block the generation of the first transfer data TD<1>. The inversion control circuit 350 may generate the first to sixteenth transfer data TD<1:16> by inverting or not inverting the first to sixteenth read data RD<1:16> corresponding to bits having logic high levels among the first to sixteenth masking data MD<1:16>. For example, when the second masking data MD<2> is inputted at a logic high level, the inversion control circuit 350 may generate the second transfer data TD<2> by inverting or not inverting the second read data RD<2>, The inversion control circuit 350 may generate the first to sixteenth transfer data TD<1:16> by correcting an error of the first to sixteenth read data RD<1:16> depending on logic levels of the first to sixteenth correction signals CRS<1:16>. For example, when the first correction signal CRS<1> is a logic low level, the inversion control circuit 350 may generate the first transfer data TD<1> by correcting an error of the first read data RD<1>. The case where an error of the first read data RD<1> is corrected means an operation in which the first transfer data TD<1> is generated by inverting the logic level of the first read data RD<1>.

While the inversion control circuit 350 illustrated in FIG. 9 is illustrated as one circuit for the sake of convenience in explanation, it is to be noted that the inversion control circuit 350 may be Implemented by 16 circuits corresponding to the number of bits of the first to sixteenth transfer data TD<1:16>.

FIG. 10 is a block diagram illustrating a configuration of the write control circuit 253 in accordance with an embodiment of the present disclosure. As illustrated in FIG. 10, the write control circuit 253 may include a write data generation circuit 360 and a write parity generation circuit 370.

In the internal write operation, the write data generation circuit 360 may generate the first to sixteenth write data WD<1:16> from the first to sixteenth masking data MD<1:16>, the first to sixteenth input data IND<1:16>, and the first to sixteenth transfer data TD<1:16>.

In the internal read operation, the write parity generation circuit 370 may generate the first to fourth write parities WP<1:4> by performing an ECC encoding operation on the first to sixteenth transfer data TD<1:16> when the start signal STR is enabled.

Figure 11:
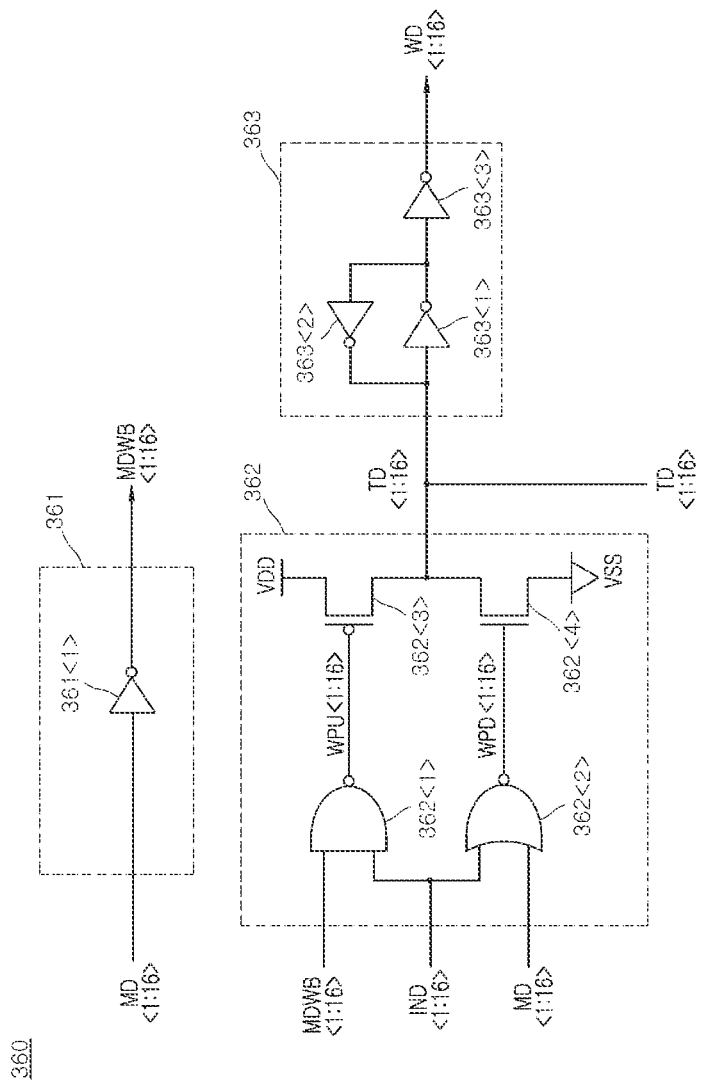
FIG. 11 is a circuit diagram illustrating a configuration of a write data generation circuit included in the write control circuit illustrated in FIG. 10.

FIG. 11 is a circuit diagram illustrating a configuration of the write data generation circuit 360 in accordance with an embodiment of the present disclosure. As illustrated in FIG. 11, the write data generation circuit 360 may include a write masking signal generation circuit 361, a transfer data driving circuit 362, and a write data output circuit 363.

The write masking signal generation circuit 361 may be implemented by an inverter 361<1>, The write masking signal generation circuit 361 may generate first to sixteenth write masking signals MDWB<1:16> by inverting and buffering the first to sixteenth masking data MD<1:16>.

The transfer data driving circuit 362 may be implemented by a NAND gate 362<1>, a NOR gate 362<2>, a PMOS transistor 362<3>, and an NMOS transistor 362<4>, When the first to sixteenth write masking signals MDWB<1:16> are inputted at logic high levels and the first to sixteenth input data IND<1:16> are logic high levels, the NAND gate 362<1> may generate first to sixteenth write pull-up signals WPU<1:16> having logic low levels. When the first to sixteenth write masking signals MDWB<1:16> are inputted at logic low levels, the NAND gate 362<1> may generate the first to sixteenth write pull-up signals WPU<1:16> having logic high levels. When the first to sixteenth masking data MD<1:16> are inputted at logic low levels and the first to sixteenth input data IND<1:16> are logic low levels, the NOR gate 362<2> may generate first to sixteenth write pull-down signals WPD<1:16> having logic high levels. When the first to sixteenth masking data MD<1:16> are inputted at logic high levels, the NOR gate 362<2> may generate the first to sixteenth write pull-down signals WPD<1:16> having logic low levels. When the first to sixteenth write pull-up signals WPU<1:16> are inputted at logic low levels, the PMOS transistor 362<3> may generate the first to sixteenth transfer data TD<1:16> having logic high levels. When the first to sixteenth write pull-down signals WPD<1:16> are inputted at logic high levels, the NMOS transistor 362<4> may generate the first to sixteenth transfer data TD<1:16> having logic low levels.

The transfer data driving circuit 362 may drive the first to sixteenth transfer data TD<1:16> by buffering the first to sixteenth input data IND<1:16> corresponding to bits having logic low levels among the first to sixteenth masking data MD<1:16>. For example, when the first masking data MD<1> is a logic low level, the transfer data driving circuit 362 may drive the first transfer data TD<1> by buffering the first input data IND<1>. The transfer data driving circuit 362 may block the driving of the first to sixteenth transfer data TD<1:16> corresponding to bits having logic high levels among the first to sixteenth masking data MD<1:16>. For example, when the second masking data MD<2> is inputted at a logic high level, the transfer data driving circuit 362 may block the driving of the second transfer data TD<2> by blocking the input of the second input data IND<2>.

The write data output circuit 363 may be implemented by inverters 363<1>, 363<2>, and 363<3>. The write data output circuit 363 may latch the first to sixteenth transfer data TD<1:16>. The write data output circuit 363 may generate the first to sixteenth write data WD<1:16> by buffering the latched first to sixteenth transfer data TD<1:16>.

While the write data generation circuit 360 illustrated in FIG. 11 is illustrated as one circuit for the sake of convenience in explanation, it is to be noted that the write data generation circuit 360 may be implemented by 16 circuits corresponding to the number of bits of the first to sixteenth write data WD<1:16>.

Figure 12:
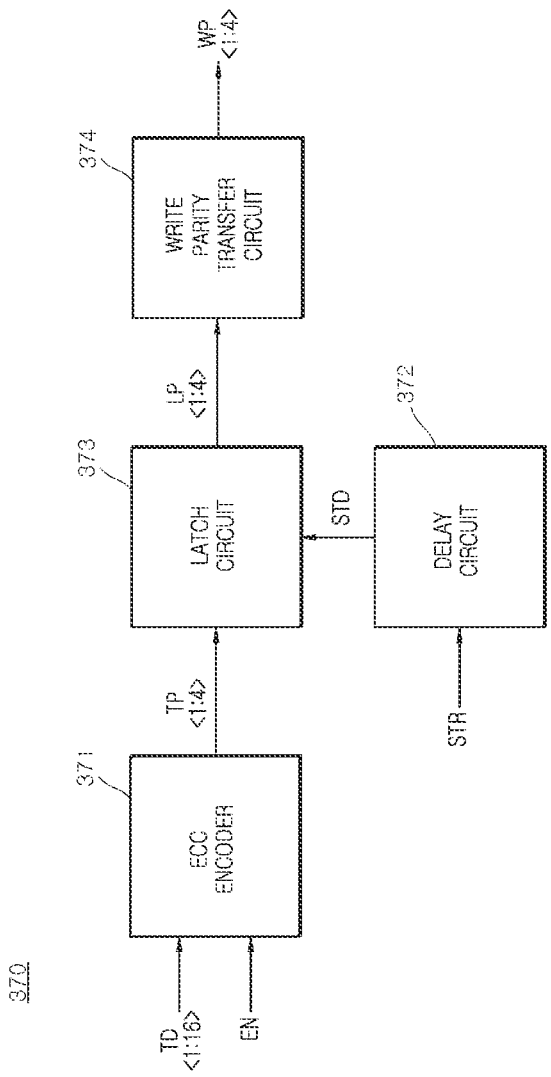
FIG. 12 is a block diagram illustrating a configuration of a write parity generation circuit included in the write control circuit illustrated in FIG. 10.

FIG. 12 is a block diagram illustrating a configuration of the write parity generation circuit 370 in accordance with an embodiment of the present disclosure. As illustrated in FIG. 12, the write parity generation circuit 370 may include an ECC encoder 371, a delay circuit 372, a latch circuit 373, and a write parity transfer circuit 374.

The ECC encoder 371 may generate first to fourth transfer parities TP<1:4> by performing an ECC encoding operation on the first to sixteenth transfer data TD<1:16> during the enable period of the enable signal EN, The ECC encoder 371 may generate the first to fourth transfer parities TP<1:4> from the first to sixteenth transfer data TD<1:16> by using an error correction code (ECC) during the enable period of the enable signal EN. The enable signal EN may be set as a signal which is enabled in the data masking operation.

The delay circuit 372 may generate the strobe delay signal STD by delaying the start signal STR by an ECC encoding operation time. The delay circuit 372 may be implemented by a replica delay circuit which has a delay amount the same as the ECC encoding operation time.

The latch circuit 373 may latch the first to fourth transfer parities TP<1:4> when the strobe delay signal STD is enabled. The latch circuit 373 may output the first to fourth transfer parities TP<1:4>, which are latched when the strobe delay signal STD is enabled, as first to fourth latch parities LP<1:4>. The latch circuit 373 may generate the first to fourth latch parities LP<1:4> by latching the first to fourth transfer parities TP<1:4> at a time point when the strobe delay signal STD generated as the start signal STR is delayed by the ECC encoding operation time is enabled.

The write parity transfer circuit 374 may generate the first to fourth write parities WP<1:4> from the first to fourth latch parities LP<1:4>. The write parity transfer circuit 374 may be implemented by a general driver so as to generate the first to fourth write parities WP<1:4> from the first to fourth latch parities LP<1:4>.

Figure 13:
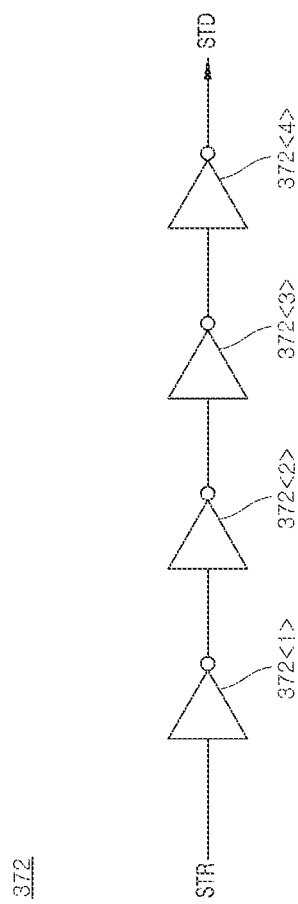
FIG. 13 is a circuit diagram illustrating a configuration of a delay circuit included in the write parity generation circuit illustrated in FIG. 12.

FIG. 13 is a circuit diagram illustrating a configuration of the delay circuit 372 in accordance with an embodiment of the present disclosure. As illustrated in FIG. 13, the delay circuit 372 may be implemented by a plurality of inverters 372<1>, 372<2>, 372<3>, and 372<4> which are coupled in series.

The delay circuit 372 may generate the strobe delay signal STD by delaying the start signal STR by the ECC encoding operation time described above. The delay circuit 372 is implemented by four inverters. However, according to an embodiment, the number of inverters may be adjusted to have the same delay amount as the ECC encoding operation time. The delay amount of the delay circuit 372 may be adjusted depending on the number of inverters.

The internal read operation of the data masking operation in accordance with an embodiment of the present disclosure will be described below with reference to FIG. 14.

Figure 14:
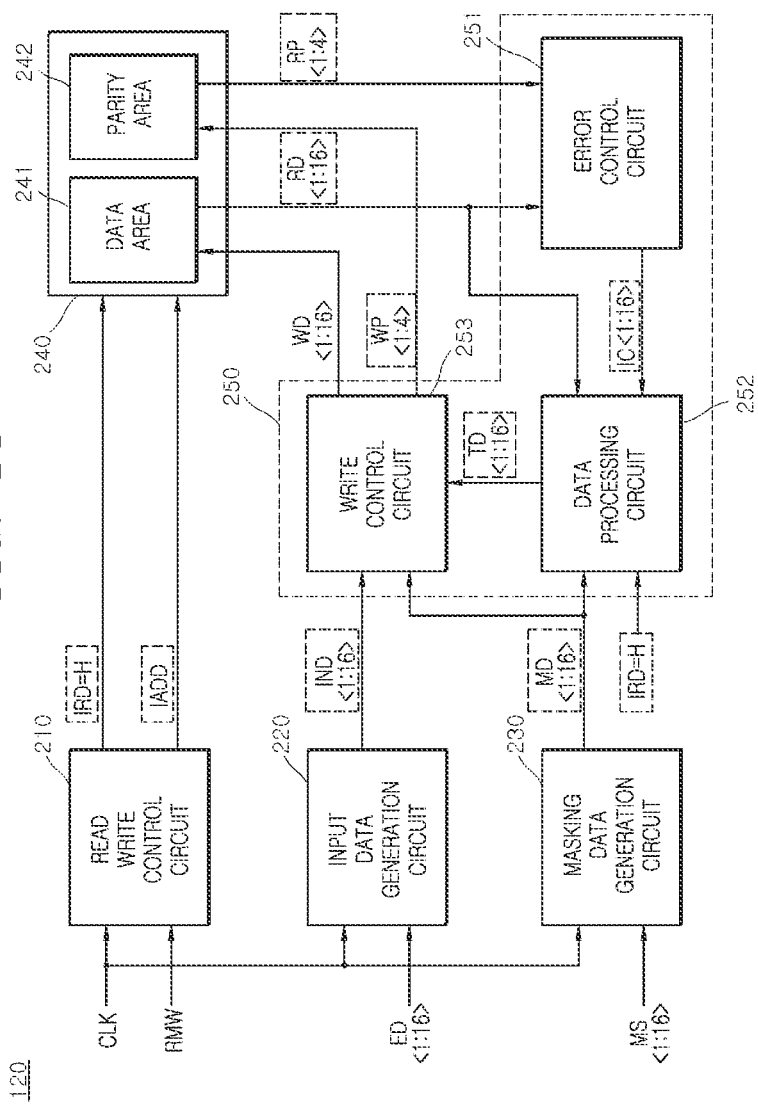
FIGS. 14 and 15 are diagrams to assist in describing a data masking operation of the electronic device illustrated in FIG. 2 in accordance with an embodiment of the present disclosure.

Referring to FIG. 14, the read write control circuit 210 generates the internal read command IRD having a logic high level and the address IADD from the command RMW in synchronization with the clock CLK.

The input data generation circuit 220 generates the first to sixteenth input data IND<1:16> based on the first to sixteenth external data ED<1:16> in synchronization with the clock CLK.

The masking data generation circuit 230 generates the first to sixteenth masking data MD<1:16> based on the first to sixteenth masking signals MS<1:16> in synchronization with the dock CLK.

As the internal read command IRD is inputted, the core circuit 240 outputs, based on the address IADD, the first to sixteenth read data RD<1:16> stored in the data area 241 and the first to fourth read parities RP<1:4> stored in the parity area 242.

The error control circuit 251 generates the first to sixteenth correction control signals IC<1:16> for correcting an error included in the first to sixteenth read data RD<1:16>, from the first to fourth read parities RP<1:4>.

The data processing circuit 252 generates the error control signal ECCCTR having a logic low level, from the internal read command IRD. The data processing circuit 252 corrects an error of the first to sixteenth read data RD<1:16> by the first to sixteenth correction control signals IC<1:16> during a period in which the error control signal ECCCTR is disabled to a logic low level. The data processing circuit 252 generates the first to sixteenth transfer data TD<1:16> from the first to sixteenth masking data MD<1:16> and the error-corrected first to sixteenth read data RD<1:16>.

The write control circuit 253 generates the first to fourth write parities WP<1:4> by performing an ECC encoding operation on the first to sixteenth transfer data TD<1:16>.

That is to say, in the internal read operation of the data masking operation, the electronic device 120 in accordance with an embodiment of the present disclosure generates the first to fourth write parities WP<1:4> from the first to sixteenth masking data MD<1:16> and the error-corrected first to sixteenth read data RD<1:16>.

The internal write operation of the data masking operation in accordance with an embodiment of the present disclosure will be described below with reference to FIG. 15.

Figure 15:
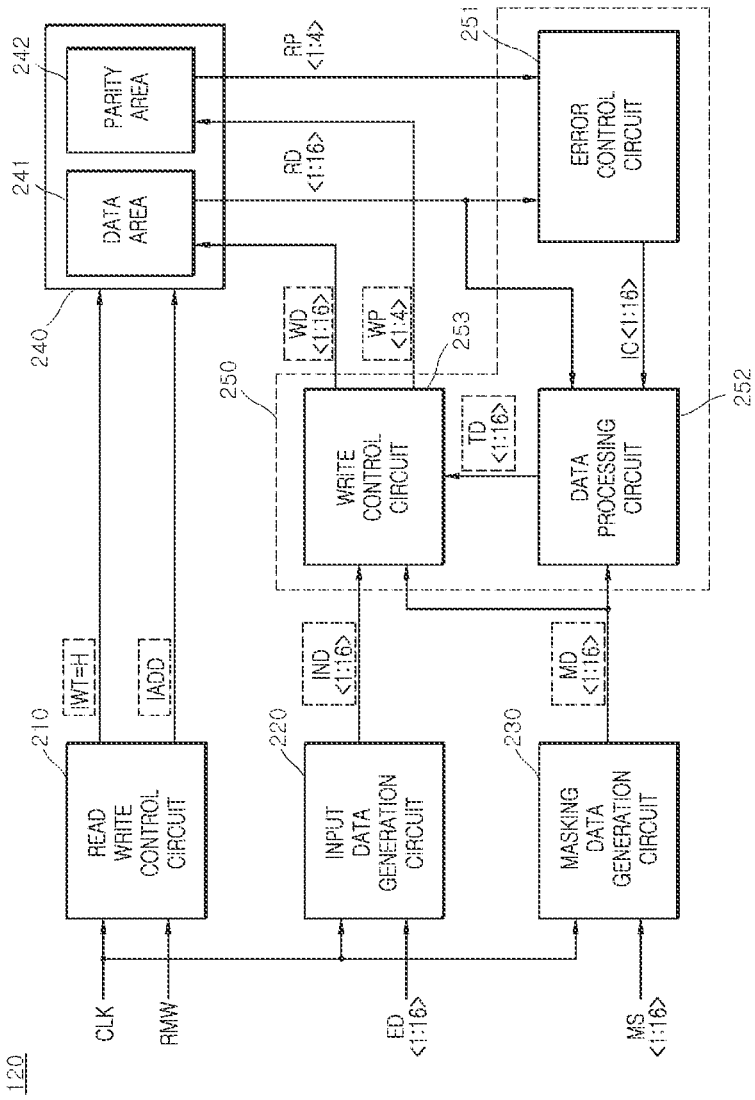

Referring to FIG. 15, after generating the internal read command IRD from the command RMW in synchronization with the clock CLK, the read write control circuit 210 generates the internal write command IWT having a logic high level and the address IADD.

The input data generation circuit 220 generates the first to sixteenth input data IND<1:16> based on the first to sixteenth external data ED<1:16> in synchronization with the clock CLK.

The masking data generation circuit 230 generates the first to sixteenth masking data MD<1:16> based on the first to sixteenth masking signals MS<1:16> in synchronization with the clock CLK.

In the internal write operation, the data processing circuit 252 generates the error control signal ECCCTR having a logic high level. The data processing circuit 252 generates the first to sixteenth transfer data TD<1:16> from the error-uncorrected first to sixteenth read data RD<1:16> and the first to sixteenth masking data MD<1:16>, by the error control signal ECCCTR having a logic high level.

The write control circuit 253 generates the first to sixteenth write data WD<1:16> from the first to sixteenth transfer data TD<1:16>, the first to sixteenth masking data MD<1:16> and the first to sixteenth input data IND<1:16>.

When the internal write command IWT is inputted, the core circuit 240 stores the first to sixteenth write data WD<1:16> in the data area 241, based on the address IADD. When the internal write command IWT is inputted, the core circuit 240 stores the first to fourth write parities WP<1:4> generated in the internal read operation, in the parity area 242, based on the address IADD.

In other words, in the internal write operation of the data masking operation, the electronic device 120 in accordance with an embodiment of the present disclosure may generate the first to sixteenth transfer data TD<1:16> from the error-uncorrected first to sixteenth read data RD<1:16>. In the internal write operation of the data masking operation, the electronic device 120 may store the first to sixteenth write data WD<1:16> generated from the first to sixteenth transfer data TD<1:16>, the first to sixteenth masking data MD<1:16>, and the first to sixteenth input data IND<1:16>. In the internal write operation of the data masking operation, the electronic device 120 may store the first to fourth write parities WP<1:4> generated in the internal read operation.

The data masking operation of the electronic system 100 in accordance with an embodiment of the present disclosure will be described below with reference to FIG. 16, as a write-back disable operation.

Figure 16:
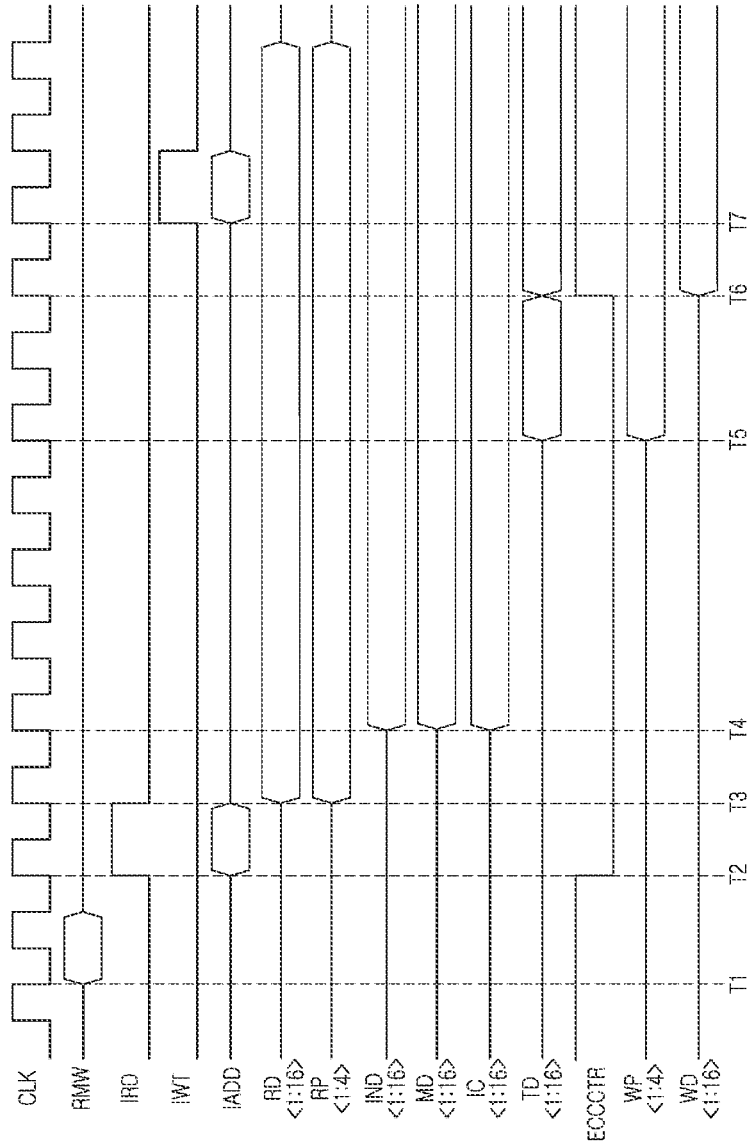
FIG. 16 is a timing diagram to assist in describing the operation of the electronic system illustrated in FIG. 1 in accordance with an embodiment of the present disclosure.

Referring to FIG. 16, at a time point T1, the controller 110 outputs the dock CLK and the command RMW for performing the data masking operation, to the electronic device 120.

The read write control circuit 210 receives the command RMW in synchronization with the dock CLK.

At a time point T2, the read write control circuit 210 generates the internal read command IRD having a logic high level and the address IADD from the command RMW inputted at the time point T1.

The data processing circuit 252 generates the error control signal ECCCTR which is disabled to a logic low level, from the internal read command IRD having a logic high level.

At a time point T3, the core circuit 240 outputs the first to sixteenth read data RD<1:16> stored in the data area 241, by the internal read command IRD and the address IADD inputted at the time point T2, The core circuit 240 outputs the first to fourth read parities RP<1:4> stored in the parity area 242, by the internal read command IRD and the address IADD inputted at the time point T2.

At a time point T4, the input data generation circuit 220 generates the first to sixteenth input data IND<1:16> based on the first to sixteenth external data ED<1:16> in synchronization with the clock CLK.

The masking data generation circuit 230 generates the first to sixteenth masking data MD<1:16> based on the first to sixteenth masking signals MS<1:16> in synchronization with the clock CLK. A bit having a logic high level among the first to sixteenth masking signals MS<1:16> may be set as a bit for blocking the input of corresponding data among the first to sixteenth input data IND<1:16>.

The error control circuit 251 generates the first to sixteenth correction control signals IC<1:16> for correcting an error included in the first to sixteenth read data RD<1:16>, from the first to fourth read parities RP<1:4>.

At a time point T5, because the error control signal ECCCTR is disabled to a logic low level, the data processing circuit 252 corrects an error of the first to sixteenth read data RD<1:16> by the first to sixteenth correction control signals IC<1:16>. The data processing circuit 252 generates the first to sixteenth transfer data TD<1:16> from the first to sixteenth masking data MD<1:16> and the error-corrected first to sixteenth read data RD<1:16>, The write control circuit 253 generates the first to fourth write parities WP<1:4> by performing an ECC encoding operation on the first to sixteenth transfer data TD<1:16>.

At a time point T6, in the internal write operation, the data processing circuit 252 generates the error control signal ECCCTR which is enabled to a logic high level.

Because the error control signal ECCCTR is enabled to a logic high level, the data processing circuit 252 does not correct an error of the first to sixteenth read data RD<1:16>. The data processing circuit 252 generates the first to sixteenth transfer data TD<1:16> from the first to sixteenth masking data MD<1:16> and the error-uncorrected first to sixteenth read data RD<1:16>, Namely, the first to sixteenth transfer data TD<1:16> generated from the error-uncorrected first to sixteenth read data RD<1:16> may be generated to have a logic level combination different from that of the first to sixteenth transfer data TD<1:16> generated from the error-corrected first to sixteenth read data RD<1:16> at the time point T5.

The write control circuit 253 generates the first to sixteenth write data WD<1:16> from the first to sixteenth transfer data TD<1:16> generated from the error-uncorrected first to sixteenth read data RD<1:16>, the first to sixteenth masking data MD<1:16>, and the first to sixteenth input data IND<1:16>.

At a time point T7, the read write control circuit 210 generates the internal write command IWT having a logic high level and the address IADD from the command RMW inputted at the time point T1.

The core circuit 240 stores the first to sixteenth write data WD<1:16> in the data area 241 by the internal write command IWT and the address IADD. The core circuit 240 stores the first to fourth write parities WP<1:4> in the parity area 242 by the internal write command IWT and the address IADD.

Figure 17:
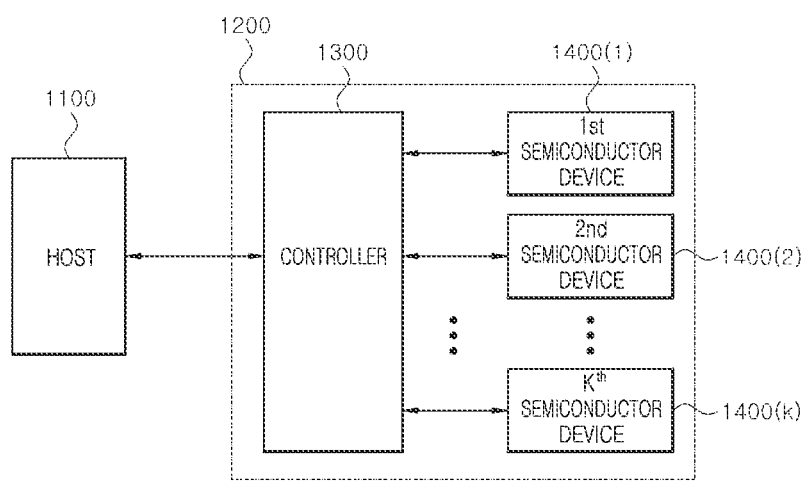
FIG. 17 is a diagram illustrating a configuration of an electronic system in accordance with an embodiment of the present disclosure, to which the electronic system illustrated in FIGS. 1 to 16 is applied.

As is apparent from the above description, the electronic system 100 in accordance with an embodiment of the present disclosure may support a write-back disable operation of generating a write parity using error-corrected read data in an internal read operation and restoring write data, generated from error-uncorrected read data, and the write parity in an internal write operation. Also, the electronic system 100 in accordance with an embodiment of the present disclosure may secure the reliability of data stored in a data area, by generating a write parity using error-corrected read data in an internal read operation and restoring write data, generated from error-uncorrected read data, and the write parity in an internal write operation, FIG. 17 is a block diagram illustrating a configuration of an electronic system in accordance with an embodiment of the present disclosure. As illustrated in FIG. 17, the electronic system may include a host 1100 and a semiconductor system 1200.

The host 1100 and the semiconductor system 1200 may transmit signals to each other by using an interface protocol. Examples of the interface protocol used between the host 1100 and the semiconductor system 1200 may include MMC (multimedia card), ESDI (enhanced small disk interface), IDE (integrated drive electronics), PCI-E (peripheral component interconnect-express), ATA (advanced technology attachment), SATA (serial ATA), PATA (parallel ATA), SAS (serial attached SCSI), and USB (universal serial bus).

The semiconductor system 1200 may include a controller 1300 and semiconductor devices 1400(1:k). The controller 1300 may control the semiconductor devices 1400(1:k) so that the semiconductor devices 1400(1:k) perform a data masking operation. Each of the semiconductor devices 1400(1:k) may support a write-back disable operation of generating a write parity using error-corrected read data in an internal read operation and restoring write data, generated from error-uncorrected read data, and the write parity in an internal write operation. Also, each of the semiconductor devices 1400(1:k) may, in a data masking operation, correct an error of read data and then generate a write parity using the error-corrected read data in an internal read operation and restore write data and the write parity, generated from the error-corrected read data, in an internal write operation, thereby securing the reliability of data stored in a data area.

The controller 1300 may be implemented by the controller 110 illustrated in FIG. 1. Each of the semiconductor devices 1400(1:k) may be implemented by the electronic device 120 illustrated in FIGS. 1 and 2, According to an embodiment, each of the semiconductor devices 1400(1:k) may be implemented by one among a DRAM (dynamic random access memory), a PRAM (phase change random access memory), an RRAM (resistive random access memory), an MRAM (magnetic random access memory), and an FRAM (ferroelectric random access memory).

While various embodiments have been described above, it will be understood by those skilled in the art that the described embodiments represent only a small subset of possible embodiments. Accordingly, the electronic device for performing a data masking operation described herein should not be limited based on the described embodiments.

What is claimed is:

1. An electronic device comprising:
a core circuit configured to store write data and a write parity after outputting read data and a read parity in a data masking operation; and
an error correction circuit configured to:
correct an error included in the read data, based on the read parity;
generate the write parity from the error-corrected read data, input data, and masking data; and
generate the write data from the error-uncorrected read data, the input data, and the masking data.

2. The electronic device according to claim 1, wherein:
the error correction circuit is configured to generate, in an internal read operation, the write parity from transfer data generated by replacing a bit, which is blocked by a bit of the masking data, among bits included in the error-corrected read data, with a bit of the input data; and
the error correction circuit is configured to generate, in an internal write operation, the write data from the transfer data generated by replacing a bit, which is blocked by a bit of the masking data, among bits included in the error-uncorrected read data, with a bit of the input data.

3. The electronic device according to claim 1, wherein the error correction circuit comprises:
an error control circuit configured to generate, from the read parity, a correction control signal for correcting an error included in the read data;
a data processing circuit configured to:
correct, in the internal read operation, an error of the read data by an error control signal and the correction control signal;
generate, in the internal read operation, the transfer data from the masking data and the error-corrected read data; and
generate the transfer data from the masking data and the error-uncorrected read data in the internal write operation; and
a write control circuit configured to:
generate the write parity by performing an error correction code (ECC) encoding operation on the transfer data; and
generate the write data from the masking data, the input data and the transfer data.

4. The electronic device according to claim 3, wherein the error control circuit comprises:
a syndrome generation circuit configured to generate, from the read data and the read parity, a syndrome including information on an error included in the read data; and
an ECC decoder configured to generate the correction control signal by performing an ECC decoding operation on the syndrome.

5. The electronic device according to claim 4, wherein syndrome generation circuit comprises:
a parity generation circuit configured to generate a parity including information on an error of the read data, when an enable signal which is enabled in the data masking operation is enabled; and
a logic circuit configured to generate the syndrome by comparing the parity and the read parity.

6. The electronic device according to claim 3, wherein the data processing circuit comprises:
an error control signal generation circuit configured to generate the error control signal which is disabled by an internal read command and is enabled by a strobe delay signal;
a correction signal generation circuit configured to generate a correction signal based on the correction control signal during a period in which the error control signal is disabled; and
an inversion control circuit configured to:
receive the masking data and the read data; and
generate the transfer data by correcting an error of the read data by the correction signal.

7. The electronic device according to claim 6, wherein the correction signal generation circuit is configured to block generation of the correction signal during a period in which the error control signal is enabled.

8. The electronic device according to claim 6, wherein the inversion control circuit comprises:
a read masking signal generation circuit configured to generate a read masking signal by inverting and buffering the masking data; and
a read driver configured to:
generate the transfer data by inverting or not inverting the read data by the correction signal when the masking data is enabled; and
block generation of the transfer data when the masking data is disabled.

9. The electronic device according to claim 3, wherein the write control circuit comprises:
a write data generation circuit configured to generate the write data from the masking data, the input data, and the transfer data; and
a write parity generation circuit configured to generate the write parity by performing the ECC encoding operation on the transfer data after a start signal is inputted to the write parity generation circuit.

10. The electronic device according to claim 9, wherein the write data generation circuit comprises:
a write masking signal generation circuit configured to generate a write masking signal by inverting and buffering the masking data;
a write driver configured to:
drive the transfer data by buffering the input data when the masking data is disabled; and
block driving of the transfer data when the masking data is enabled; and
a write data output circuit configured to latch the transfer data and generate the write data by buffering the latched transfer data.

11. The electronic device according to claim 9, wherein the write parity generation circuit comprises:
an ECC encoder configured to generate a transfer parity by performing the ECC encoding operation on the transfer data;
a delay circuit configured to generate a strobe delay signal by delaying the start signal by a time of the ECC encoding operation;
a latch circuit configured to generate a latch parity by latching the transfer parity when the strobe delay signal is enabled; and
a write parity transfer circuit configured to generate the write parity from the latch parity.

12. An electronic device comprising:
a masking data generation circuit configured to generate masking data from a masking signal inputted from outside the electronic device;
an error control circuit configured to generate a correction control signal for correcting an error of read data, from a read parity generated in an internal read operation; and
a data processing circuit configured to correct an error of the read data by an error control signal and the correction control signal and generate transfer data from the masking data and the error-corrected read data, in the internal read operation, and generate the transfer data from the masking data and the error-uncorrected read data in an internal write operation.

13. The electronic device according to claim 12, wherein the error control circuit comprises:

a syndrome generation circuit configured to generate a syndrome including information on an error included in the read data, from the read data and the read parity; and
an error correction code (ECC) decoder configured to generate the correction control signal by performing an ECC decoding operation on the syndrome.

14. The electronic device according to claim 13, wherein the syndrome generation circuit comprises:
a parity generation circuit configured to generate a parity including information on an error of the read data, when an enable signal which is enabled in a data masking operation is enabled; and
a logic circuit configured to generate the syndrome by comparing the parity and the read parity.

15. The electronic device according to claim 13, wherein the data processing circuit comprises:
an error control signal generation circuit configured to generate the error control signal which is disabled by an internal read command and is enabled by a strobe delay signal;
a correction signal generation circuit configured to generate a correction signal based on the correction control signal during a period in which the error control signal is disabled; and
an inversion control circuit configured to:
receive the masking data and the read data; and
generate the transfer data by correcting an error of the read data by the correction signal.

16. The electronic device according to claim 15, wherein the correction signal generation circuit is configured to block generation of the correction signal during a period in which the error control signal is enabled.

17. The electronic device according to claim 15, wherein the inversion control circuit comprises:
a read masking signal generation circuit configured to generate a read masking signal by inverting and buffering the masking data; and
a read driver configured to:
generate the transfer data by inverting or not inverting the read data by the correction signal when the masking data is enabled; and
block generation of the transfer data when the masking data is disabled.

18. The electronic device according to claim 12, further comprising:
an input data generation circuit configured to generate input data from external data inputted from outside the electronic device; and
a write control circuit configured to:
generate a write parity by performing an error correction code (ECC) encoding operation on the transfer data; and
generate write data from the masking data, the input data and the transfer data.

19. The electronic device according to claim 18, wherein the write control circuit comprises:
a write data generation circuit configured to generate the write data from the masking data, the input data and the transfer data; and
a write parity generation circuit configured to generate the write parity by performing the ECC encoding operation on the transfer data after a start signal is inputted to the write parity generation circuit.

20. The electronic device according to claim 19, wherein the write data generation circuit comprises:

a write masking signal generation circuit configured to generate a write masking signal by inverting and buffering the masking data;

a write driver configured to:
  drive the transfer data by buffering the input data when the masking data is disabled; and
  block driving of the transfer data when the masking data is enabled; and a write data output circuit configured to latch the transfer data and generate the write data by buffering the latched transfer data.

21. The electronic device according to claim 19, wherein the write parity generation circuit comprises:
  an ECC encoder configured to generate a transfer parity by performing the ECC encoding operation on the transfer data;
  a delay circuit configured to generate a strobe delay signal by delaying the start signal by a time of the ECC encoding operation;
  a latch circuit configured to generate a latch parity by latching the transfer parity when the strobe delay signal is enabled; and
  a write parity transfer circuit configured to generate the write parity from the latch parity.

* * * * *